(12) United States Patent
Suzuki et al.

(10) Patent No.: US 9,194,044 B2
(45) Date of Patent: Nov. 24, 2015

(54) DEPOSITION APPARATUS AND METHOD

(75) Inventors: Kunihiko Suzuki, Shizuoka (JP);
Shinichi Mitani, Shizuoka (JP)

(73) Assignees: NuFlare Technology, Inc., Shizuoka (JP); Central Research Institute of Electric Power Industry, Tokyo (JP); Denso Corporation, Aichi (JP); Toyota Jidosha Kabushiki Kaisha, Aichi-ken (JP)

( * ) Notice: Subject to any disclaimer, the term of this patent is extended or adjusted under 35 U.S.C. 154(b) by 485 days.

(21) Appl. No.: 13/029,402

(22) Filed: Feb. 17, 2011

(65) Prior Publication Data

US 2011/0206866 A1     Aug. 25, 2011

(30) Foreign Application Priority Data

Feb. 19, 2010   (JP) ................................. 2010-034496

(51) Int. Cl.
C23C 16/00        (2006.01)
C23C 16/455       (2006.01)

(52) U.S. Cl.
CPC .................................. *C23C 16/4557* (2013.01)

(58) Field of Classification Search
CPC .................................................. C23C 16/4557
USPC ................... 118/722, 724, 723 R; 156/345.37
See application file for complete search history.

(56) References Cited

U.S. PATENT DOCUMENTS

| | | | | |
|---|---|---|---|---|
| 5,225,032 A | * | 7/1993 | Golecki | 117/90 |
| 5,704,985 A | * | 1/1998 | Kordina et al. | 118/725 |
| 5,798,016 A | * | 8/1998 | Oehrlein et al. | 156/345.37 |
| 6,192,829 B1 | * | 2/2001 | Karazim et al. | 118/723 AN |
| 6,227,140 B1 | * | 5/2001 | Kennedy et al. | 118/723 R |
| 7,361,222 B2 | * | 4/2008 | Janzen et al. | 117/103 |
| 8,075,692 B2 | * | 12/2011 | Osborne et al. | 118/715 |
| 2001/0000864 A1 | * | 5/2001 | Shiomi et al. | 117/84 |
| 2002/0069818 A1 | * | 6/2002 | Naito et al. | 117/109 |
| 2006/0057287 A1 | * | 3/2006 | Foss et al. | 427/248.1 |
| 2007/0283890 A1 | * | 12/2007 | Park et al. | 118/727 |

FOREIGN PATENT DOCUMENTS

| | | |
|---|---|---|
| JP | 2006-097080 | 4/2006 |
| JP | 2008-108983 | * 5/2008 |

OTHER PUBLICATIONS

Notification of Reason for Rejection issued by the Japanese Patent Office on November 12, 2013, in counterpart Japanese Patent Application No. 2010-034496.

* cited by examiner

*Primary Examiner* — Keath Chen
(74) *Attorney, Agent, or Firm* — Finnegan, Henderson, Farabow, Garrett & Dunner, L.L.P.

(57) ABSTRACT

A deposition apparatus 50 includes a chamber 1 having at its top section a gas inlet 4 for supplying deposition gas 25. Inside chamber 1 is a susceptor 7 on which to place a substrate 6; a heater 8 located below the substrate 6; and a liner 2 for covering the inner walls of the chamber 1. Apparatus 50 deposits a film on the substrate 6 by supplying deposition gas 25 from gas inlet 4 into chamber 1 while heating substrate 6. An upper electric resistance heater cluster 35 is located between the inner walls of the chamber 1 and liner 2 such that the upper heater 35 surrounds the liner 2. The upper heater 35 is divided vertically into electric resistance heaters 36, 37, and 38 which are independently temperature-controlled. The substrate 6 is heated with the use of both heater 8 and the upper heater cluster 35.

6 Claims, 3 Drawing Sheets

PRIOR ART

DEPOSITION APPARATUS AND METHOD

BACKGROUND OF THE INVENTION

1. Field of the Invention

The present invention relates to a film deposition apparatus and a film deposition method.

2. Background Art

Epitaxy or epitaxial growth is often employed in manufacturing semiconductor devices that require relatively thick crystalline films. Examples of these devices include power semiconductor devices such as insulated-gate bipolar transistors (IGBTs) and the like.

Vapor-phase epitaxy, a form of epitaxial growth, requires that the film deposition chamber in which a semiconductor substrate (e.g., a silicon wafer) has been placed be kept at atmospheric pressure (0.1 MPa or 760 Torr) or lower. After the substrate has been heated up to a given temperature, the chamber is supplied with a deposition gas which includes a reactive gas. When the deposition gas reaches the surface of the heated substrate, the reactive gas undergoes thermal decomposition or hydrogen reduction, thereby depositing an epitaxial film on the substrate's surface.

Manufacturing large-thickness epitaxial wafers at a high yield rate requires increasing the film deposition speed, which involves consecutively supplying deposition gas onto the surface of a wafer after the wafer has been uniformly heated. Thus, conventional deposition apparatuses are typically designed to rotate a wafer at high speed, thereby increasing the speed of epitaxial growth (see Japanese Patent Laid-Open No. 2008-108983, as an example).

FIG. 3 is a cross section of a conventional deposition apparatus 200 that employs epitaxial growth.

As illustrated in FIG. 3, the deposition apparatus 200 includes the following components: a chamber 201 having upper and lower sections; a hollow liner 202 located inside the chamber 201 to protect its inner walls; coolant passageways 203a and 203b through which coolant water flows to cool the chamber 201; a gas inlet 204 from which to introduce a deposition gas 225; gas outlets 205 from which to discharge the deposition gas 225 after use; a semiconductor substrate 206 (e.g., a wafer) on which vapor-phase epitaxy is performed; a susceptor 207 for supporting the substrate 206; a heater 208, fixed to a support (not illustrated), for heating the substrate 206; flanges 209 for connecting the upper and lower sections of the chamber 201; a packing material 210 for sealing the flanges 209; flanges 211 used for connection to the gas outlet 205; and packing material 212 for sealing the flanges 211.

The liner 202 is typically formed from quartz. The liner 202 includes a head section 231, and an upper open portion of the head section 231 is provided with a shower plate 220 which serves as a flow straightening vane for uniformly supplying the deposition gas 225 across the top surface of the substrate 206.

The heater 208 is used to heat the substrate 206 while a rotating mechanism (not illustrated), rotates the susceptor 207, thereby also rotating the substrate 206 placed on the susceptor 207. After the substrate 206 has been heated sufficiently, the deposition gas 225, which includes a reactive gas, is fed from the gas inlet 204 into the chamber 201 while the substrate 206 is rotating; the gas 225 flows past the through-holes 221 of the shower plate 220, then moves downwardly inside the head section 231 toward the top surface of the substrate 206. Note that the liner 202 also includes a barrel section 230 inside which the susceptor 207 is placed and that the head section 231 is smaller in inner diameter than the barrel section 230.

After reaching the top surface of the substrate 206, the deposition gas 225 undergoes thermal decomposition or hydrogen reduction, thereby depositing a crystalline film thereon. By-product gases, that is, the resulting gas from the deposition process is discharged from the gas outlets 205 located at the bottom of the chamber 201.

As stated above, the packing materials 210 and 212 are used for sealing the flanges 209 of the chamber 201 and the flanges 211 of the gas outlets 205, respectively. The packing materials 210 and 212 are formed of fluorine rubber and can withstand a temperature of up to 300 degrees Celsius or thereabouts. Via the coolant passageways 203a and 203b cooling the chamber 201, it is possible to cool the packing materials 210 and 212 as well and prevent them from deteriorating due to heat.

During vapor-phase epitaxy onto the substrate 206, the heater 208 heats the substrate 206 up to more than 1,000 degrees Celsius. Depending on the type of epitaxial film to be deposited on the substrate 206, the substrate 206 may need to be heated even up to 1,500 degrees Celsius or higher.

An example of a material to be used for such an epitaxial film is silicon carbide (SiC), which is a promising material for high-voltage power semiconductor devices. The energy gap of silicon carbide is twice or three times as large as those of conventional semiconductor device materials such as silicon (Si) and gallium arsenide (GaAs), and its breakdown electric field is larger than those of conventional materials by approximately one order of magnitude. To form an SiC monocrystalline wafer by growing SiC crystals on a substrate, the substrate needs to be heated up to more than 1,500 degrees Celsius or thereabout. What is more desirable is to heat the entire surface of the substrate uniformly at 1,650 degrees Celsius or higher.

As stated above, when the deposition apparatus 200 of FIG. 3 is used to obtain an SiC monocrystalline wafer by growing SiC crystals on the substrate 206, it is necessary to heat the substrate 206 to a high temperature. Accordingly, when it is necessary to heat the substrate 206 to, for example, 1,650 degrees Celsius, the temperature of the heater 208 needs to be maintained at an even higher temperature, for example, 2,000 degrees Celsius or thereabouts.

The heater 208, located below the substrate 206, is often an electric resistance heater formed from carbon (C) or the like.

However, difficulties are involved in using an electric resistance heater to heat the substrate 206 up to such a high temperature as stated above because the connectors for electrically connecting the heater and electrodes are low in thermal resistance. In other words, it is difficult to apply resistance heating for heating the substrate 206 up to more than 1,500 degrees Celsius.

For this reason, some deposition apparatuses that are designed to obtain SiC monocrystalline wafers are provided with two types of heaters: an electric resistance heater located below a substrate and a high-frequency induction heater located at a chamber side-wall section.

The high-frequency induction heater heats the substrate by the radiant heat resulting from induction heating and plays a complementary role in substrate heating.

The electric resistance heater allows precise temperature control of the substrate and plays a major role in substrate heating while the high-frequency induction heater plays a complementary role. The use of the two types of heaters prevents excessive heating of the electric resistance heater.

However, the use of the high-frequency induction heater, which is located at a chamber side-wall section, creates the following problem: the heating effect of the high-frequency induction heater varies depending on its distance from a substrate to be heated.

Thus, the use of a high-frequency induction heater necessitates the positional and height adjustment of the coils of the induction heater to control its temperature. This renders fine and precise temperature control of the induction heater almost impossible.

Therefore, the use of an electric resistance heater and a high-frequency induction heater results in less precise temperature control of heating means as a whole despite the precise temperature control capabilities of the electric resistance heater.

The present invention has been contrived to address the above issue. An object of the invention is thus to provide a deposition apparatus which has a heater located below a substrate to be heated and another heater located at a chamber side-wall section and uses these two heaters to achieve precise temperature control of the substrate while preventing excessive heating of the heater located below the substrate and also to provide a deposition method using this apparatus.

SUMMARY OF THE INVENTION

The present invention relates to an apparatus and a method used for film deposition. The apparatus comprising: a chamber; a gas inlet for supplying a deposition gas into the chamber; a gas outlet located at a bottom section of the chamber; a susceptor, located inside the chamber on which to place a substrate; a liner for covering the inner walls of the chamber; a heater located inside the chamber so as to be positioned below the substrate placed on the susceptor and an upper electric resistance heater cluster located between the inner walls of the chamber and the liner so as to surround the liner, wherein the upper electric resistance heater cluster is divided vertically into a plurality of electric resistance heaters and wherein the plurality of electric resistance heaters are independently temperature-controlled.

In another embodiment of this invention; a deposition method for depositing a film on a substrate placed on a susceptor installed within a chamber by supplying deposition gas from a top section of the chamber toward the substrate while heating the substrate with the use of an electric resistance heater located below the substrate, wherein an upper electric resistance heater cluster is located between inner walls of the chamber and a liner, provided inside the chamber, for covering the inner walls of the chamber, such that the upper electric resistance heater cluster surrounds the liner, wherein the upper electric resistance heater cluster is divided vertically into a plurality of electric resistance heaters so that the plurality of electric resistance heaters can be independently temperature-controlled and wherein the film is deposited by heating the substrate while performing temperature control on both the electric resistance heater located below the substrate and the upper electric resistance heater cluster.

DETAILED DESCRIPTION OF THE EMBODIMENTS

Figure 1:
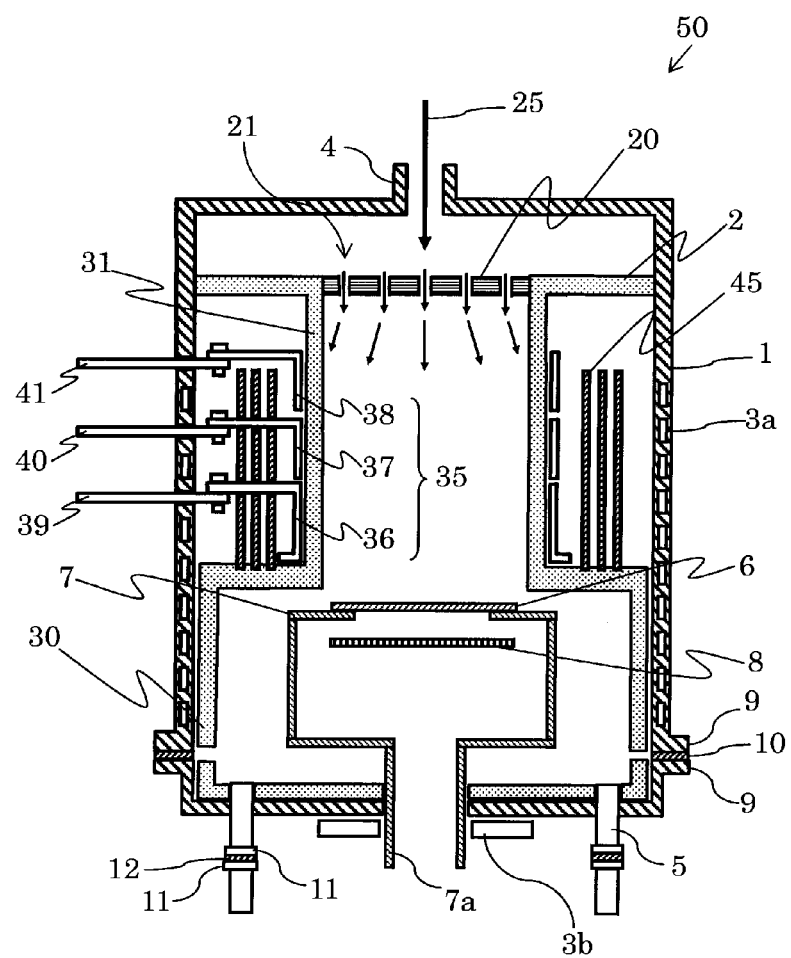
FIG. 1 is a schematic cross section of a film deposition apparatus according to an embodiment of the invention.

FIG. 1 is a schematic cross section of a film deposition apparatus 50 according to an embodiment of the invention. In this preferred embodiment, the deposition apparatus 50 is designed to deposit an SiC (silicon carbide) crystalline film on the top surface of a substrate 6. The substrate 6 is thus a SiC wafer. Of course, it is also possible to use other wafers formed of different materials if so required. Examples of alternative wafers include an Si wafer, other insulative wafers such as an $SiO_2$ (quartz) wafer and the like, and semi-insulative wafers such as a high-resistance gallium arsenide (GaAs) wafer and the like.

The deposition apparatus 50 of FIG. 1 comprises the following components: a film deposition chamber 1 having upper and lower sections; a hollow liner 2 located inside the chamber 1 to protect its inner walls; coolant passageways 3a and 3b through which coolant water flows to cool the chamber 1; a gas inlet 4 from which to introduce a deposition gas 25; gas outlets 5 from which to discharge the deposition gas 25 after use; a susceptor 7 on which to place the substrate 6; a heater 8, fixed to a support (not illustrated), for heating the substrate 6; flanges 9 for connecting the upper and lower sections of the chamber 1; a packing material 10 for sealing the flanges 9; flanges 11 used for connection to the gas outlets 5; and packing material 12 for sealing the flanges 11.

The deposition gas 25 includes propane ($C_3H_8$) and silane ($SiH_4$) as reactive gases. After being mixed with hydrogen gas, which serves as a carrier gas, the deposition gas 25 is fed into the chamber 1 through the gas inlet 4. Note that silane can be substituted with dichlorosilane or trichlorosilane.

The heater 8 is an electric resistance heater formed from SiC.

Placed on the susceptor 7 is the substrate 6, such as an SiC wafer or the like, on which vapor-phase epitaxy is performed. The susceptor 7 is connected to a rotating mechanism (not illustrated), via a susceptor support 7a. During vapor-phase epitaxy, the rotating mechanism rotates the susceptor 7, thereby rotating the substrate 6 placed thereon at high speed.

The liner 2 is formed from a highly thermally resistant material; for example, it is formed from SiC-coated carbon. The liner 2 includes a head section 31, and an upper open portion of the head section 31 is provided with a shower plate 20 which serves as a flow straightening vane for uniformly supplying the deposition gas 25 across the top surface of the substrate 6. The shower plate 20 includes multiple through-holes 21 through which the deposition gas 25 passes.

The reason the liner 2 is provided is that the walls of the chamber 1 are formed of stainless steel, as is common to typical deposition apparatuses. That is, the liner 2 is provided to cover all the inner stainless-steel surfaces of the chamber 1 so that they will not be exposed to vapor-phase epitaxy. This prevents particle or metal contamination of the substrate 6 during vapor-phase epitaxy as well as preventing corrosion of the inner stainless-steel surfaces of the chamber 1.

In addition to the head section 31, the liner 2 also includes a barrel section 30 inside which the susceptor 7 is placed. The head section 31 is smaller in inner diameter than the barrel section 30. Vapor-phase epitaxy is performed on the substrate 6 while the susceptor 7 on which the substrate 6 has been placed is rotated at high speed inside the barrel section 30. The above-described shower plate 20 serves to supply the deposition gas 25 uniformly across the top surface of the substrate 6 placed on the susceptor 7 within the barrel section 30.

The inner diameter of the head section 31 of the liner 2 is determined based on the positions of the through-holes 21 of the shower plate 20 and on the size of the substrate 6. Accordingly, after flowing past the through-holes 21 of the shower plate 20, the deposition gas 25 can flow straight down to the top surface of the substrate 6 without diffusing, whereby the deposition gas 25 can be gathered over the top surface of the substrate 6 in an efficient manner. The thus-constructed liner 2 allows efficient, high-speed vapor-phase epitaxy over the surface of the substrate 6.

After being supplied from the gas inlet 4 into the deposition apparatus 50, the deposition gas 25 flows through the head section 31 and efficiently moves toward the surface of the substrate 6. Note here that the space between the periphery of the substrate 6 and the liner 2 is narrow so that the deposition gas 25 can flow over the substrate 6 in the form of a laminar flow.

Around the head section 31 of the liner 2 is an upper heater cluster 35. Thus, the deposition apparatus 50 includes two heaters: the heater 8, located below the substrate 6, for heating the substrate 6 from below and the upper heater cluster 35, located around the head section 31 of the liner 2, for heating the substrate 6 from above.

As illustrated in FIG. 1, the upper heater cluster 35 is divided into three in a direction orthogonal to the top surface of the substrate 6, that is, in a vertical direction of the apparatus 50. The upper heater cluster 35 thus comprises a first heater 36, a second heater 37, and a third heater 38; these are arranged in this order from the side of the barrel section 30 to the side of the shower plate 20.

The first heater 36, second heater 37, and third heater 38 are each an electric resistance heater formed from carbon (C) or the like.

These heaters 36, 37, and 38 are connected to and thus supported by a first connector 39, a second connector 40, and a third connector 41, respectively, via screws or the like. The first connector 39, second connector 40, and third connector 41 penetrate a side wall of the chamber 1 and are thus fixed thereto.

Electric current can be applied independently to the first heater 36, second heater 37, and third heater 38 through their respective first connector 39, second connector 40, and third connector 41.

This allows independent temperature control of the first heater 36, second heater 37, and third heater 38 as desired. The deposition apparatus 50 is thus provided with independently temperature-controllable resistance heaters; a first heater 36, second heater 37, and third heater 38, arranged in this order perpendicular from the top of the substrate, that is, these heaters are arranged in this order from the side of the barrel section 30 to the side of the shower plate 20, in a mutually spaced manner around the liner 2, for example, the heaters may be formed in a belt-shape surrounding the liner 2. Heater 36 is therefore positioned closest to the substrate and may be formed with a flanged edge positioned parallel to the side of the barrel section 30, thereby allowing efficient heating of the substrate.

Accordingly, the upper heater cluster 35 is capable of independently controlling the temperatures of its components: the first heater 36, second heater 37, and third heater 38. Thus, the upper heater cluster 35 as a whole can be temperature-controlled in a precise manner.

As stated above, the first connector 39, second connector 40, and third connector 41 are fixed to a side wall of the chamber 1, and it is possible to independently adjust the respective distances from a side wall of the head section 31 of the liner 2 to the first heater 36, second heater 37, and third heater 38.

See FIG. 1 to note that the first heater 36, or the lowermost heater of the upper heater cluster 35, extends along the outer walls of the liner 2. That is, the lower section of the first heater 36 is shaped in such a way as to extend along the corner section between the head section 31 and the barrel section 30. The thus-shaped first heater 36 allows efficient heating of the substrate 6 located inside the barrel section 30.

As above, the deposition apparatus 50 of FIG. 1 includes the heater 8, located below the substrate 6, and the upper heater cluster 35, located around the head section 31 of the liner 2.

The heater 8 performs fine and precise temperature control of the substrate 6 and plays a major role in heating the substrate 6 while the upper heater cluster 35 plays a complementary role in heating the substrate 6. The use of the two heaters, heater 8 and upper heater cluster 35 serves to prevent excessive heating of the heater 8.

The upper heater cluster 35 also allows heating of the substrate 6 in a precisely controlled manner. As a result, the two heaters, upper heater cluster 35 and heater 8 as a whole are capable of controlling the temperature of the substrate 6 in a very precise manner.

While the upper heater cluster 35 is, as stated above, vertically divided into three heaters, i.e., the first heater 36, second heater 37, and third heater 38, the present invention is not limited thereto.

For instance, the upper heater cluster 35 may instead be divided vertically into two heaters. Of course, it is also possible to use a single electric resistance heater as the upper heater cluster 35 without division. More preferably, however, the upper heater cluster 35 should be divided into two or more heaters for the purpose of achieving local temperature control of the upper heater 35.

To achieve even more precise local temperature control of the upper heater cluster 35, it is further possible to divide the upper heater cluster 35 vertically into, for example, four or five heaters. In such a case, more heater connectors are necessary for the additional heaters so as to achieve independent temperature control, as in the case of FIG. 1 in which the upper heater cluster 35 is divided into three heaters.

As above, the upper heater cluster 35 of the deposition apparatus 50, which is located around the head section 31 of the liner 2, can be divided vertically into any desired number of heaters as long as desired local temperature control of the upper heater cluster 35 can be achieved.

While the method described above utilizes a cylindrical liner, and an upper electric resistance heater that is belt-shaped, it is also possible to use a different shaped liner, and a different shaped heater, for example, a hexagonal or octagonal liner with a plurality of heaters on each flat edge of the liner. These heaters can function together as one complete heater unit, for example, as second heater 37, but also allow individual heating from each separate heater, this separation can ease replacement of individual heaters if necessary, or further, the resistance heaters can operate in a horizontal direction as per the present embodiment.

As illustrated in FIG. 1, the deposition apparatus 50 also has a heat reflector 45 located between the inner side walls of the chamber 1 and the outer walls of the head section 31 of the liner 2 so as to surround the first heater 36, second heater 37, and third heater 38 of the upper heater cluster 35; the purpose of the heat reflector 45 is to allow the upper heater cluster 35 to efficiently heat the substrate 6 located inside the barrel section 30 of the liner 2.

The heat reflector 45 is formed from highly thermally resistant carbon. The heat reflector 45 extends vertically, installed on the ceiling of the barrel section 30 which is the section connecting the barrel section 30 and the head section 31 of the liner 2.

As illustrated in FIG. 1, the heat reflector 45 has a multi-layered structure (e.g., three-layered structure) so that the heat emitted from the upper heater cluster 35 can be reflected efficiently toward the substrate 6 inside the liner 2.

The presence of the heat reflector 45 also prevents the heat emitted by the upper heater cluster 35 from reaching the side walls of the chamber 1, thereby preventing an excessive temperature rise in the chamber 1. The heat reflector 45 can also have a single-layered or two-layered structure by taking into consideration the heat reflection or insulation capabilities of the heat reflector 45; alternatively, the heat reflector 45 can have three or more layers.

Figure 2:
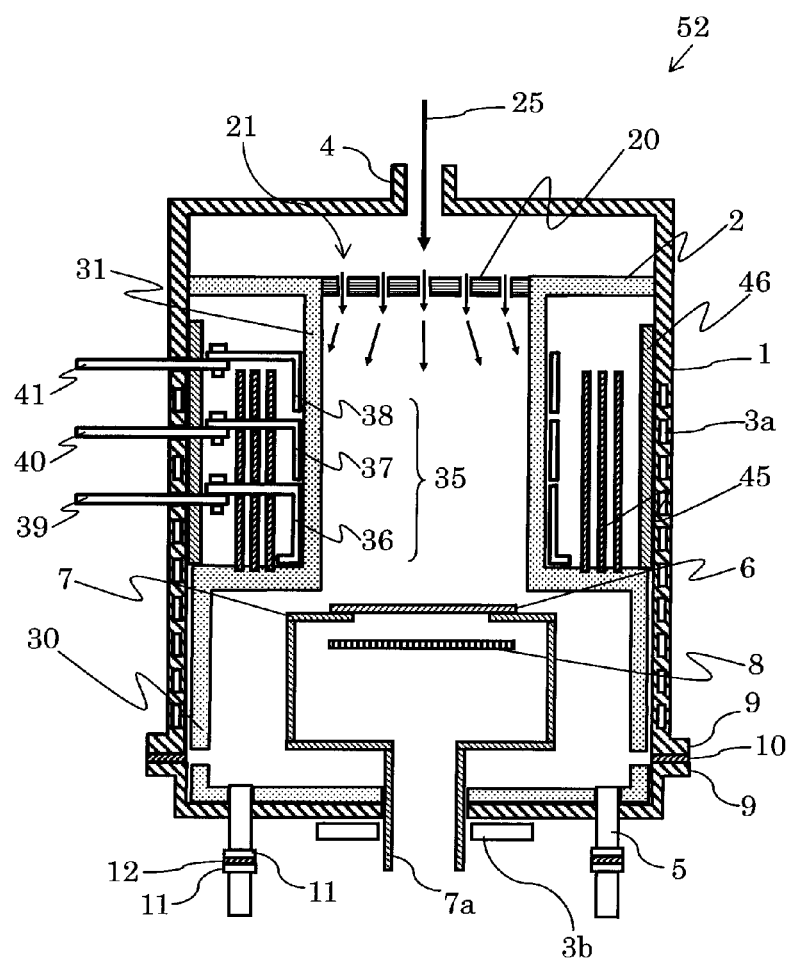
FIG. 2 is a schematic cross section of a deposition apparatus according to another embodiment of the invention.

As illustrated in FIG. 2, a heat insulator 46 can be provided around the upper heater cluster 35 so as to cover part of the inner walls of the chamber 1. FIG. 2 is a schematic cross section of a deposition apparatus 52 according to another embodiment of the invention.

The heat insulator 46 of the deposition apparatus 52 serves to block the heat emitted from the upper heater cluster 35, thereby preventing the heat from excessively increasing the temperature of the stainless-steel side walls of the chamber 1.

The deposition apparatus 52 of FIG. 2 is structurally the same as the deposition apparatus 50 of FIG. 1, except that the former has the heat insulator 46 attached to the inner walls of the chamber 1. Note that the same elements in the figures are denoted by the same reference numerals for the sake of convenience.

Although not illustrated, a radiation thermometer is provided at an upper inner section of the chamber 1 to measure the surface temperature of the substrate 6 while the substrate 6 is being heated. It is thus preferred that the upper inner section of the chamber 1 and the shower plate 20 be formed of quartz so that the chamber 1 and the shower plate 20 will not affect the temperature measurement by the radiation thermometer. After the temperature measurement, the data is sent to a control device (not illustrated).

The control device controls the operation of a three-way valve (not illustrated) installed inside a passageway through which hydrogen gas, i.e., carrier gas, flows. Specifically, when the temperature of the substrate 6 reaches or exceeds a particular value, the control device activates the three-way valve to control the supply of the hydrogen gas to the chamber 1. The control device also controls the supply of electric current to the heater 8 and the upper heater cluster 35.

As stated above, the packing materials 10 and 12 of the deposition apparatus 50 are used for sealing the flanges 9 of the chamber 1 and the flanges 11 of the gas outlets 5, respectively. The packing materials 10 and 12 are formed of fluorine rubber and can withstand a temperature of up to 300 degrees Celsius or thereabouts. Via the coolant passageways 3a and 3b cooling the chamber 1, it is possible to cool the packing materials 10 and 12 as well and prevent them from deteriorating due to heat.

The above-described deposition apparatus 50 heats the substrate 6 up to more than 1,500 degrees Celsius using both the heater 8 and the upper heater cluster 35 while the rotating mechanism (not illustrated), rotates the substrate 6 inside the chamber 1 with the substrate 6 being placed on the susceptor 7. After the substrate 6 has been heated sufficiently, the deposition gas 25, which includes reactive gases and carrier gas, is fed from the gas inlet 4 into the chamber 1; the deposition gas 25 flows past the through-holes 21 of the shower plate 20, then moves downwardly toward the top surface of the substrate 6.

When the deposition gas 25 reaches the surface of the substrate 6, the gas 25 undergoes thermal decomposition or hydrogen reduction, thereby depositing a crystalline film on the surface of the substrate 6. By-product gases, that is, the resulting gas from the deposition process is discharged from the gas outlets 5 located at the bottom of the chamber 1. Described next with reference to FIG. 1 is a film deposition method according to the invention which involves the use of the above deposition apparatus 50. Deposition of an epitaxial film (e.g., SiC film) on the substrate 6 (i.e., SiC wafer) includes the following steps.

The substrate 6 is first loaded into the chamber 1. The substrate 6 is placed on the susceptor 7, and the rotating mechanism (not illustrated) starts rotating the susceptor support 7a, thereby also rotating the substrate 6 placed on the susceptor 7 at 50 rpm or thereabouts.

Next, electric current is applied to the heater 8 and also to the first heater 36, second heater 37, and third heater 38 of the upper heater cluster 35 via the first connector 39, second connector 40, and third connector 41, respectively, thereby heating the heater 8 and the upper heater cluster 35.

The heat from heater 8 and upper heater cluster 35 heats the substrate 6. The heating of the substrate 6 is continued until the temperature of the substrate 6 reaches a given temperature selected from the deposition temperature range of 1,500 to 1,700 degrees Celsius (e.g., 1,650 degrees Celsius). At the same time, coolant water flows inside the coolant passageways 3a and 3b to cool the chamber 1 thereby preventing an excessive rise in the temperature of the chamber 1.

After the temperature of the substrate 6 reaches 1,650 degrees Celsius, the heater 8 and the upper heater cluster 35 are temperature-controlled to maintain the substrate 6 at that temperature. Fine temperature control around that temperature is achieved by the heater 8. Independent temperature control is also performed on the first heater 36, the second heater 37, and the third heater 38 of the upper heater cluster 35 as an aid to the fine temperature control of the substrate 6 by the heater 8.

When the substrate 6 is to be maintained at 1,650 degrees Celsius, the temperatures of the first heater 36, second heater 37, and third heater 38 of the upper heater cluster 35 can each be adjusted to 1,700 to 1,800 degrees Celsius. By doing so, the temperature of the heater 8 can be set to less than 1,800 degrees Celsius, and precise temperature control of the substrate 6 is achieved.

Figure 3:
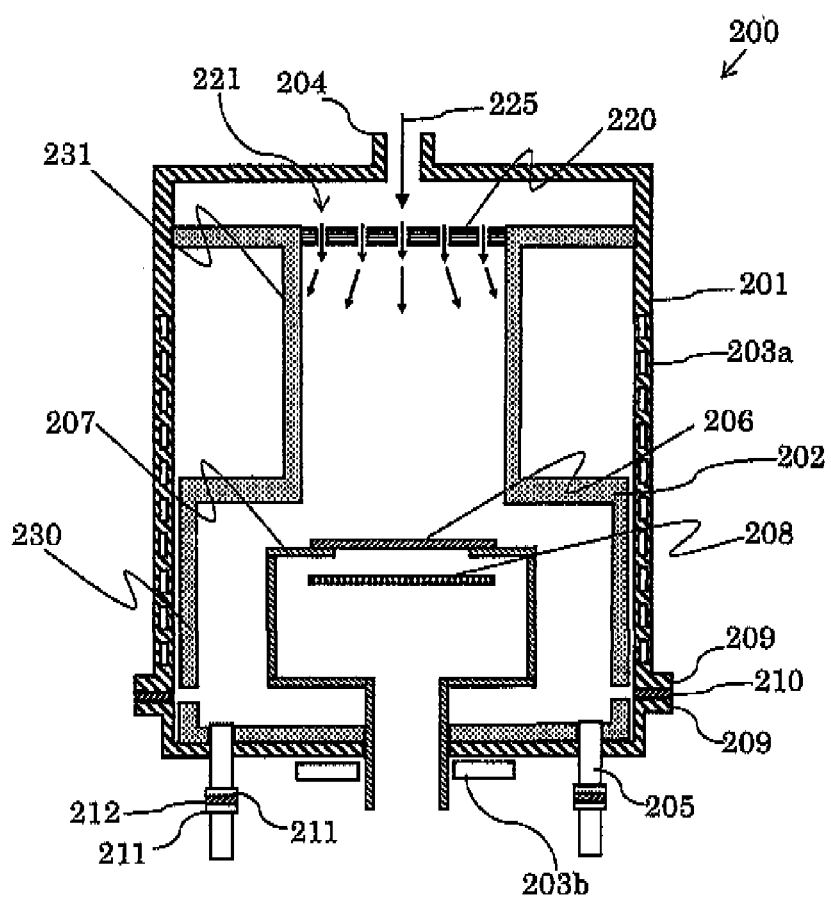
FIG. 3 is a cross section of a conventional deposition apparatus that employs epitaxial growth.

In contrast, if the conventional deposition apparatus 200 of FIG. 3 without the upper heater cluster 35 is to maintain the substrate 206 at 1,650 degrees Celsius using only the heater 208, it is known that the heater 208 needs to be heated up to approximately 2,000 degrees Celsius. Thus, when the deposition apparatus 50 of the present invention is used to deposit a film on the substrate 6, the heater 8 located below the substrate 6 need not be heated excessively. Accordingly, the substrate 6 can be heated to the desired temperature with the heater 8 being under favorable temperature conditions.

After the radiation thermometer (not illustrated) registers 1,650 degrees Celsius, meaning that the temperature of the substrate 6 has reached that value, the rotational speed of the substrate 6 is increased gradually up to 900 rpm or thereabouts. Thereafter, the deposition gas 25, which includes propane ($C_3H_8$) and silane ($SiH_4$), is fed from the gas inlet 4 into the chamber 1.

The deposition gas 25 flows past the through-holes 21 of the shower plate 20, which is attached to the head section 31 of the liner 2 of the chamber 1. The shower plate 20 acts as a flow straightening vane and serves to supply the deposition gas 25 uniformly across the top surface of the substrate 6 located inside the barrel section 30.

When the deposition gas 25 reaches the top surface of the heated substrate 6, an epitaxial film is deposited thereon.

After an epitaxial film of a particular thickness is deposited on the substrate 6, the supply of the deposition gas 25 is stopped. The supply of the carrier gas can also be stopped at the same time; alternatively, it can also be stopped after the temperature of the substrate 6, as measured by the radiation thermometer, becomes lower than a particular value.

As above, the deposition apparatuses and method of the present invention involve the use of two heaters: the electric resistance heater 8 located below the substrate 6 and the upper electric resistance heater cluster 35 located around the liner 2 of the chamber 1.

The use of the two heaters, heater 8 and upper heater 35 for heating the substrate 6 prevents excessive heating of the heater 8. Further, the upper heater 35 is vertically divided into multiple heater units, each being an electric resistance heater that can be temperature-controlled independently. This allows local temperature control of the heater 8. As a result, the two heaters, upper heater 35 and heater 8 as a whole are capable of controlling the temperature of the substrate 6 in a precise manner.

The features and advantages of the present invention may be summarized as follows.

The above-described deposition apparatus of the invention includes two heaters: the electric resistance heater located below the substrate and the upper electric resistance heater cluster located around the liner of the apparatus.

The heater located below the substrate performs fine and precise temperature control of the substrate and plays a major role in heating the substrate while the upper heater cluster plays a complementary role in heating the substrate. The use of the two heaters serves to prevent excessive heating of the heater located below the substrate.

Since the upper heater comprises vertically-divided heater units and can be locally temperature-controlled, the temperature of the substrate inside the liner can be controlled in a precise manner. As a result, the two heaters as a whole are capable of controlling the temperature of the substrate in a very precise manner.

The above-described deposition method of the invention also involves the cooperative use of the two heaters: the electric resistance heater located below the substrate and the upper electric resistance heater cluster located around the liner. The use of the two heaters for heating the substrate prevents excessive heating of the heater located below the substrate. The upper heater cluster comprises vertically-divided electric resistance heaters which can be independently temperature-controlled; thus, local temperature control of the upper heater is achieved. Accordingly, the two heaters as a whole are capable of controlling the temperature of the substrate in a very precise manner.

The present invention is not limited to the above-described embodiments but can be implemented in other various forms without departing from the scope of the invention. While we have discussed the deposition of SiC crystalline films in the above embodiments by assuming the deposition apparatuses of the invention are epitaxy apparatuses, the invention is not limited thereto. The invention is applicable to any apparatus as long as it is designed to deposit a film on the surface of a substrate by supplying deposition gas into its chamber while heating the substrate.

Further, while the description of the above embodiments has centered on what is directly relevant to the device configurations and control methods of the present invention, it is of course possible to make modifications thereto.

It should also be noted that the figures we have presented illustrate only those components relevant to the present invention and, for illustration purposes, do not present the actual scaling relations.

The scope of the present invention embraces any other deposition apparatus and component shape that include the essential elements of the invention and modifications which can be made by those skilled in the art.

The entire disclosure of a Japanese Patent Application No. 2010-034496, filed on Feb. 19, 2010 including specification, claims, drawings and summary, on which the Convention priority of the present application is based, are incorporated herein.

The invention claimed is:

1. A deposition apparatus comprising:
a chamber for depositing a SiC film on a SiC substrate;
a gas inlet for supplying a deposition gas into the chamber;
a gas outlet located at a bottom section of the chamber;
a susceptor, located inside the chamber, on which to place the SiC substrate;
a liner for covering inner walls of the chamber, wherein the liner includes a head section located above the susceptor and a barrel section inside which the susceptor is placed, an inner diameter of the head section being smaller than an inner diameter of the barrel section;
a heater located inside the chamber so as to be positioned below the SiC substrate placed on the susceptor; and
an upper electric resistance heater cluster configured to heat the SiC substrate, and located above the susceptor and between the inner walls of the chamber and the head section of the liner so as to surround the liner,
wherein the upper electric resistance heater cluster is divided vertically into a plurality of electric resistance heaters, and
wherein the plurality of electric resistance heaters are independently temperature-controlled to maintain the SiC substrate at a predetermined temperature, and
wherein a lower section of the upper electric resistance heater cluster is shaped to extend along and conform to a corner section between the head section of the liner and the barrel section of the liner.

2. The deposition apparatus according to claim 1;
wherein the liner for covering the inner walls of the chamber is cylindrical.

3. The deposition apparatus according to claim 1;
wherein the upper electric resistance heater cluster is belt-shaped.

4. The deposition apparatus according to claim 1;
wherein the upper electric resistance heater cluster is divided vertically into three to five resistance heaters.

5. The deposition apparatus according to claim 1;
wherein a heat reflector is provided between the upper electric resistance heater cluster and the inner walls of the chamber so that the heat reflector can reflect heat emitted from the upper electric resistance heater cluster.

6. The deposition apparatus according to claim 1;
wherein a heat insulator is provided around the upper electric resistance heater cluster so as to cover part of the inner walls of the chamber.

* * * * *